(12) United States Patent
Cyrusian

(10) Patent No.: US 6,525,613 B2
(45) Date of Patent: Feb. 25, 2003

(54) EFFICIENT CURRENT FEEDBACK BUFFER

(75) Inventor: Sasan Cyrusian, Scotts Valley, CA (US)

(73) Assignee: Infineon Technologies AG, Munich (DE)

( * ) Notice: Subject to any disclaimer, the term of this patent is extended or adjusted under 35 U.S.C. 154(b) by 36 days.

(21) Appl. No.: 09/866,178

(22) Filed: May 25, 2001

(65) Prior Publication Data

US 2002/0175770 A1 Nov. 28, 2002

(51) Int. Cl.[7] .............................. H03B 5/24; H03B 1/00; H03L 7/085
(52) U.S. Cl. ............................ 331/17; 331/8; 331/34; 331/57; 331/177 R; 327/109; 327/156; 327/157
(58) Field of Search ................................ 331/8, 15, 17, 331/18, 25, 34, 57, 177 R; 327/108, 109, 156–159

(56) References Cited

U.S. PATENT DOCUMENTS

| | | |
|---|---|---|
| 3,953,807 A | 4/1976 | Shade, Jr. |
| 4,345,217 A | 8/1982 | Pace |
| 4,922,141 A | 5/1990 | Lofgren et al. |
| 5,349,311 A | 9/1994 | Mentzer |
| 5,359,298 A * | 10/1994 | Abe .............................. 331/2 |
| 5,373,228 A | 12/1994 | Holle |
| 5,498,953 A | 3/1996 | Ryat |
| 5,640,681 A | 6/1997 | Barrett, Jr. et al. |
| 5,680,038 A | 10/1997 | Fiedler |
| 5,945,852 A | 8/1999 | Kosiec |
| 6,028,488 A | 2/2000 | Landman et al. |
| 6,043,718 A | 3/2000 | Diniz et al. |
| 6,052,025 A | 4/2000 | Chang et al. |
| 6,128,356 A | 10/2000 | Kleine et al. |

OTHER PUBLICATIONS

"Synchronous Recording Channels—PRML & Beyond", rev. 5.61 14.E.18, 1999, published by Knowledge Tek, Inc., Broomfield, Colorado.

"PRML: Seagate Uses Space Age Technology" available on the Internet at http://www.seagate.com/support/kb/disc/prml.html, 2 pages, last accessed Apr. 9, 2001.

"Technologies—PRML" available on the Internet at http://www.idema.or/about/industry/ind_tech_prml.html, 1 page, last accessed Apr. 9, 2001.

"Reference Guide—Hard Disk Drives" available on the Internet at http://www.storageview.com/guide2000/ref/hdd, 13 pages, last accessed Apr. 9, 2001.

"MR and PRML: Technologies in Synergy" available at on the Internet at http://www.lionsgate.com/Home/Baden/public_html_index/SCSI/Quantum_White_Papers/MR_Head/MR, 4 pages, last accessed Apr. 9, 2001.

"A Tutorial on Convolutional Coding with Viterbi Decoding" available on the Internet at http://pw1.netcom.com/~chip.f/viterbi/tutorial.html, 10 pages, last accessed Apr. 9, 2001.

* cited by examiner

Primary Examiner—David C. Mis
(74) Attorney, Agent, or Firm—Brinks Hofer Gilson & Lione

(57) ABSTRACT

An efficient current feedback buffer is revealed. The buffer is useful in power supplies for a number of analog and digital devices, including CMOS voltage controlled ring oscillators, frequency synthesizers, delay locked loops, phase accumulators, and phase locked loops. The power supply and buffer maintains a low impedance output to the load, regulates the voltage output of the supply, and rejects power line noise.

30 Claims, 9 Drawing Sheets

EFFICIENT CURRENT FEEDBACK BUFFER

BACKGROUND OF THE INVENTION

The present invention relates generally to power supplies, and more particularly the present invention relates to buffered current-feedback power supplies useful for integrated circuits made from semiconductors. Power supplies desirably include feedback mechanisms from a load using a power supply, so as to deliver the proper amount of power under the proper conditions. Typically, feedback is achieved by either voltage or current control. Voltage is used because it generally is available with no more effort or circuitry than a voltage divider. Voltage feedback tends to be more useful when there is some possibility that the load will cause a voltage swing, such as a drop in voltage when a heavy load is applied or a spike when a load is suddenly removed.

In many small-scale micro-electronics applications, such as very-large scale integration (VLSI), power for power supplies is available only under 5 volts, sometimes as low as 2.5 V or 1.5 V. This is partly to accommodate the ever-smaller dimensions of transistors used in VLSI devices, such as those made by complementary metal-oxide semiconductor (CMOS) processes. To fit more transistors onto silicon wafers, the distances from source or drain to gate become smaller and smaller, along with the ability of these transistors to resist voltage breakdown. As a result, lower and lower voltages are used. When a need arises for feedback, a power supplies typically provide only voltage feedback. Voltage feedback designs deprive these circuits of part of the limited voltage available.

In the power supply depicted in FIG. 1, a voltage supply 10 is connected at its positive and negative terminals to an amplifier having voltage feedback. The amplifier includes a current mirror amplifier 12, a second stage amplifier 14, and a third stage, a buffer amplifier 16. The amplifier has a first stage current mirror 12 and differential amplifier 20, responsive to an input signal 18, such as from a loop filter or charge pump, and a voltage feedback signal 21. By current mirror is meant that the two transistors 13, 15 have a common gate and a common source so that they will conduct currents having a magnitude set by the relative sizes of the transistors. The current mirror first stage is responsive to a differential amplifier 20. The first stage current mirror 12 provides output power to a second amplifier 14, and then to a buffer, source follower 16. The voltage output 34 is then connected to a voltage controlled oscillator (VCO, not shown).

The power supply has current sources 24, 28, 30 responsive to references signals 22, 26 and 32, at the various stages of gain. The voltage feedback signal 21 to the differential amplifier provides feedback to the amplifier to increase or decrease its output. One significant drawback to this voltage feedback design is that the minimum input voltage is limited by the tail current source 22 of the input differential amplifier and the gate-to-source voltages of the input transistors of the input differential amplifier 20. In one example the lowest input voltage value is 0.8 V and the highest value is 1.8 volts. To demonstrate, the positive voltage rail from the voltage supply 10 is about 1.8 volts. There is a drop of 0.55 volts gate-to-source voltage ($V_{gs}$) in the input transistor amplifier 20 and about 0.25 volts drain-to-source ($V_{DS}$) in the tail current source 22. Thus, the minimum input voltage is 0.55+0.25= about 0.8 volts.

The maximum output voltage is limited by the $V_{DS}$ of the second gain stage 14 and the $V_{DS}$ of the NMOS source follower 16, whose voltage equals the voltage of the output 34. The $V_{DS}$ of the second stage 14 is less than 0.1 volts and the $V_{gs}$ of the source follower 16 is a little more than 0.5 volts. Therefore, the maximum output voltage is about 0.6 volts less than the positive power supply voltage. In this case, the maximum output voltage is therefore about 1.2 volts. If this voltage feedback amplifier is used in unity gain configuration (as shown in FIG. 1), the operating range will be between 0.8 V to 1.2 V, to ensure that both input stages and output stages are operating in well-defined operating areas.

In a typical voltage controlled oscillator (VCO), the desired output voltage range may vary from 0.6 volts to 1.8 volts, far outstripping the capability of the circuit of FIG. 1. Additionally, this particular design uses 9 transistors and a capacitor, and has a three-stage amplifier. A simpler design not requiring as many components and able to vary the input and output voltage ranges is needed. Such a design will be compatible with a wide range of present devices, including charge pumps and voltage controlled oscillators.

BRIEF SUMMARY

The present invention meets these needs by providing a buffered power supply for CMOS devices that uses a current feedback design rather than a voltage feedback design. In one embodiment, a power supply has a first and a second transistor connected in series, the source of the first transistor being connected to the drain of the second transistor, the point of connection being a first point of connection in the circuit. A third transistor has a gate connected to the first point of connection, and the drains of the first and third transistors are then connected to a positive voltage supply. A drain of a fourth transistor is then connected to the source of the third transistor forming a second point of connection. The second point of connection is an output for a voltage to an electronic device, such as a VCO. In this configuration, the third transistor is a principal current source for the VCO, and the fourth transistor is a source follower or buffer for the third transistor. A fifth transistor is then connected at a third point of connection to the sources of the third and fourth transistors, and the source of the fifth transistor is then connected to the negative or return portion of the voltage supply. The first and second transistors provide a negative feedback loop for the power supply. While the embodiments are termed power supplies, it is understood that the embodiments generate a supply and control voltage for a VCO or other device. The current feedback gives the embodiments greater voltage ranges and greater control in operation.

Another embodiment is a power supply having a first transistor connected to a positive voltage supply, and second and third transistors connected to the first transistor at a first point of connection. The second transistor is connected to the first as a source follower. The source of the second transistor forms a second point of connection with a fourth transistor and with an output to an electronic device, such as a VCO. The third transistor is connected in series with the second transistor, and its drain forms a third point of connection with the gate of the fourth transistor and a drain of a fifth transistor. The fourth and fifth transistors are a main current source and a current source for the power supply, and are connected to the negative or return of the voltage supply. The third and fifth transistors provide a negative feedback loop for the power supply. Many other embodiments are also possible.

DETAILED DESCRIPTION OF THE PRESENTLY PREFERRED EMBODIMENTS

In the discussion below, transistors are described as CMOS transistors, and in particular as p-channel MOS (PMOS) or n-channel MOS (NMOS) transistors. Those skilled in the art will recognize that the terms p-channel and n-channel might more accurately describe the transistors discussed herein, since these transistors are typically not manufactured by depositing metallic elements, except possibly for external connections. Rather, source and gate regions are doped to either p-type or n-type, indicating whether the channel between source and drain conducts via depletion mode (holes) or enhancement mode (electrons). Nevertheless, the terms PMOS and NMOS are more-commonly used, and are used herein to mean those transistors manufactured by CMOS processes.

Figure 1:
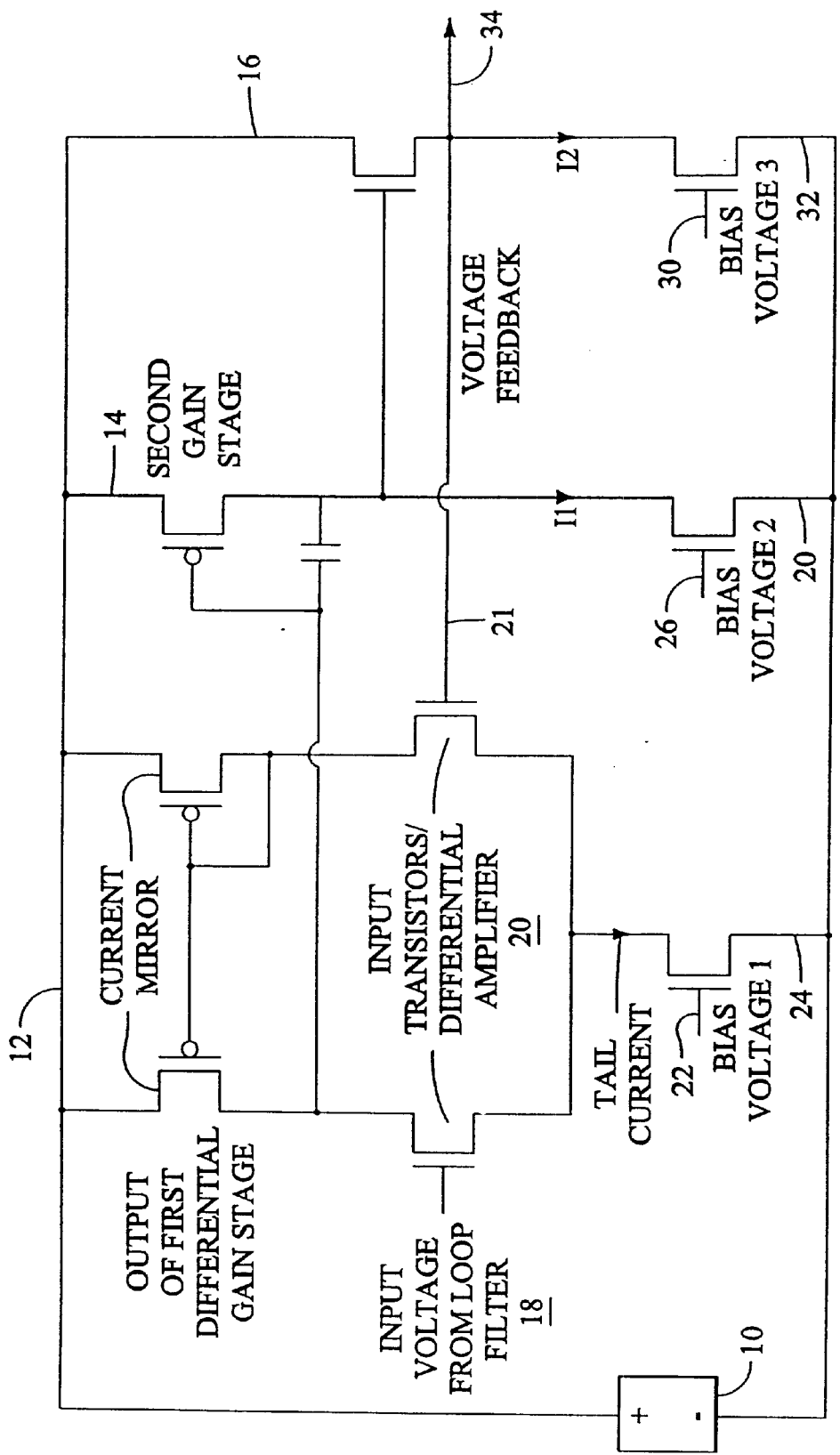
FIG. 1 is a prior art voltage feedback circuit.
Figure 2:
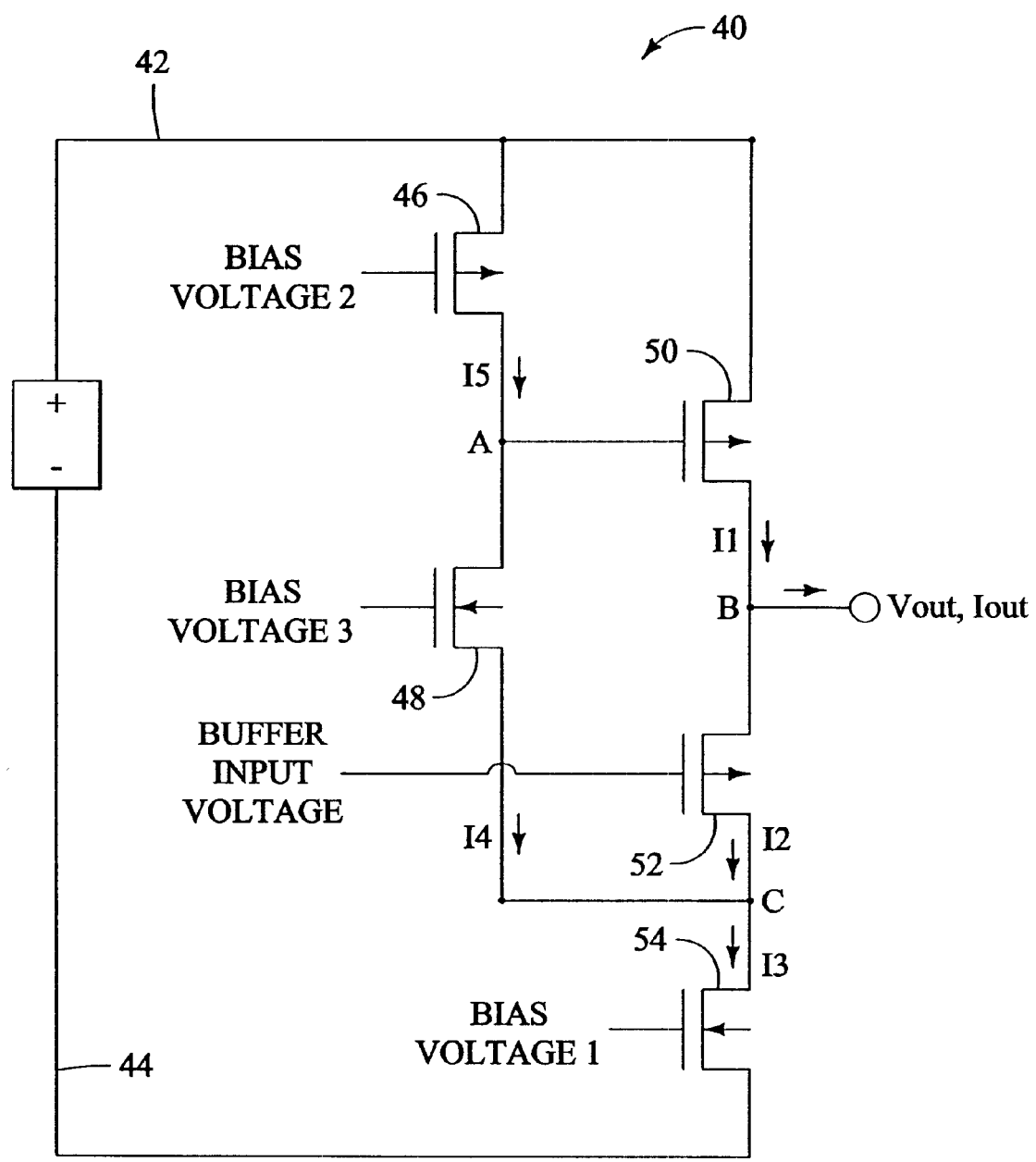
FIG. 2 is a first embodiment of a power supply with a current feedback circuit.

FIG. 2 depicts a first embodiment of a CMOS power supply 40 having current feedback. The power supply 40 includes first, third and fourth transistors 46, 50 and 52, PMOS transistors, and second and fifth transistors 48 and 54, NMOS transistors, as well as a positive voltage supply 42 and a return or negative supply 44, and may include an output terminal at point B. Current directions on the drawing are indicated by the directions of small arrows. A CMOS power supply 40 having current feedback is connected with a positive voltage supply 42 and a negative voltage supply or return 44. A first transistor 46 and a second transistor 48 are connected in series at point A, a first point of connection. The voltage supply is also connected to the drain of a third transistor 50, whose gate is tied to the first point of connection A. First transistor 46 and third transistor 50 are current sources for the power supply 40. With its gate tied to point A, transistor 50 is also an error amplifier for the negative feedback from the current feedback loop described below.

A fourth transistor 52 is connected as a buffer or source follower amplifier for third transistor 50, at a second connection point B. Point B is also a voltage output for a load of the power supply, such as a VCO. The buffer is controlled by a separate input voltage to its gate. A fifth transistor 54 is then connected to the second and fourth transistors 48, 52 at a third point of connection C, to complete the power supply. Separate bias voltages may be provided at the gates of transistors 46, 48, and 54 for control of the operation of the transistors and the circuit.

The current feedback operation of the power supply is as follows. At point A, $I_4$ must equal $I_5$, ignoring a very small of amount of gate current for transistor 50. This is an important part of the feedback circuit. If the output current increases, and $I_1$ stays constant, $I_2$ decreases, and moving oppositely, then $I_4$ increases. If $I_4$ increases, then $I_5$ must also increase, since $I_4$ is very closely tied to $I_5$. If $I_4$ increases, the voltage at point A will decrease, increasing the absolute value $V_{gs}$ of PMOS transistor 50, and increasing its output current. The adjustments will continue until the circuit stabilizes. If the load on the output decreases, and the $I_{out}$ current drops, the complementary events will take place: $I_{out}$ drops, $I_2$ increases, $I_4$ decreases, $I_5$ also decreases, the gate voltage at point A increases, $V_{gs}$ drops, and the output of transistor 50 decreases. This circuit takes advantage of current source transistors 46 and 54, which set currents $I_5$ and $I_3$. It can be shown that the current $I_1$ from the main current source 50 equals $I_3-I_5+I_{out}$. Therefore, the current from the current source 50 is equal to a constant ($I_3-I_5$) less a variable, load dependent $I_{out}$. By using current sources, current feedback makes the circuit operate.

Figure 3:
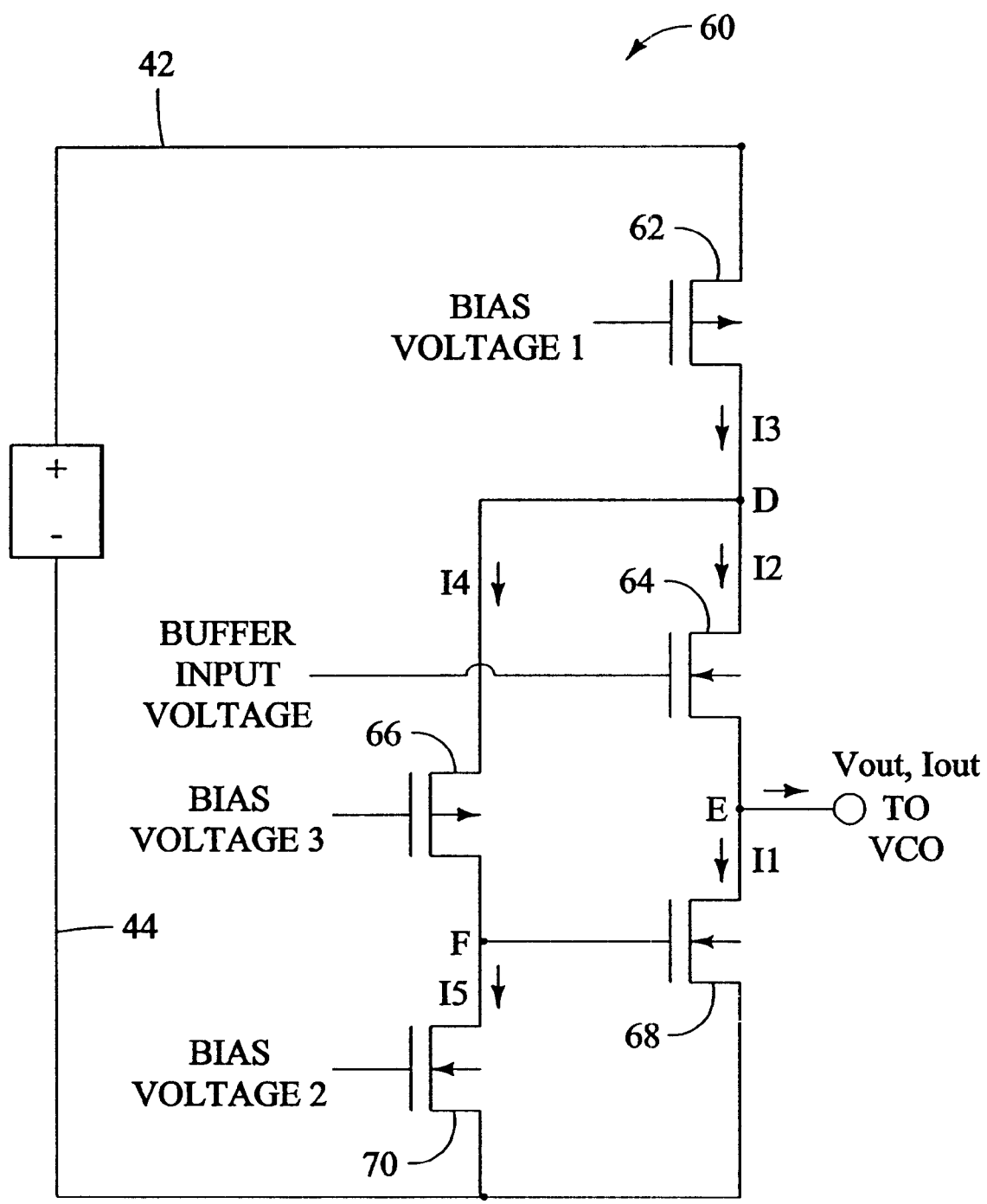
FIG. 3 is another embodiment of a current-feedback power supply.

FIG. 3 is another embodiment of a current feedback power supply 60. Power supply 60 consists of first and third transistor 62, 66, PMOS transistors, second, third, and fifth transistors 64, 68 and 79, NMOS transistors, a positive voltage supply 42 and a return or negative voltage supply 44, and may include an output terminal at point E. The power supply 60 is connected to a positive voltage 42 and a negative voltage or return or ground 44. In this configuration, the positive power supply 42 is connected to the source of a first transistor 62, whose drain is connected to second and third transistors 64, 66. Second transistor 64 is connected as a buffer or source follower to the first transistor 62 at a first point of connection D. This is also the point of connection for the drain of third transistor 66, cascaded with first transistor 62. Source follower transistor 64 may have a buffer input voltage connected to its gate. The source of source follower 64 forms a second point of connection E, connecting to power supply output and a fourth transistor 68, a main current source for this embodiment. The gate of fourth transistor 68 is then connected to the source of third transistor 66 at a third point of connection F. The sources of transistors 68, 70 are then connected to the return 44 of the voltage supply. Fourth transistor 68 is the main current source and error amplifier and fifth amplifier 70 is the secondary current source.

The operation of this embodiment may be described in terms similar to that of the previous embodiment. Current directions on the drawing are indicated by the directions of the small arrows. Except for a very small gate current to transistor 68, $I_4$ must equal $I_5$. If $I_3$ and $I_5$ are constant currents from transistors 62, and 70, then $I_3$ current must equal currents $I_4$ and $I_2$. If the output current $I_{out}$ increases, and current $I_1$ remains constant, then current $I_2$ increases. If $I_2$ increases, $I_4$ decreases and $I_5$ also decreases. This lowers the gate voltage at node F, and increase the $V_{gs}$ for transistor 68. Since transistor 68 is NMOS, the current passed by transistor 68 will decrease, that is $I_1$ will decrease. If current I1 decreases, more current is available at the output node E, which was the desired result. Current feedback makes this circuit work also.

Figure 4:
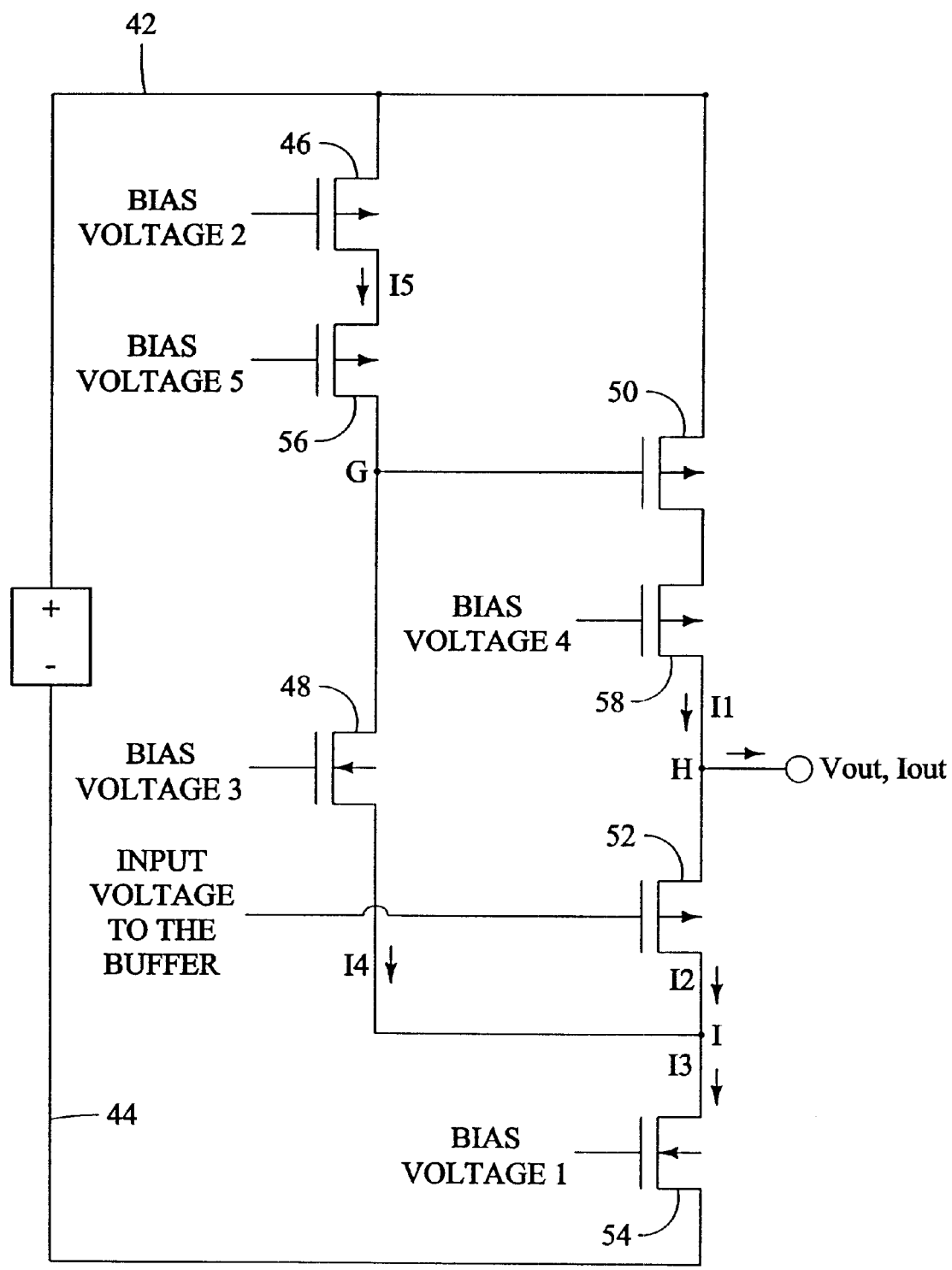
FIGS. 4 and 5 are alternate embodiments using a current-feedback design.

FIG. 4 depicts an alternative embodiment to the power supply of FIG. 2. Two additional transistors 56, 58 are cascaded with transistors 46 and 50, respectively. First additional transistor 56 is connected between first transistor 46 and a first point of connection G, which also connects to the gate of the third transistor 50. Second additional transistor 58 is cascaded with third transistor 50, placed between third transistor 50 and a second point of connection H, which forms the output to a VCO or other circuit. In this embodiment, there is also a third point of connection I between the second transistor 48, and the fourth and fifth transistors 52 and 54. These two additional transistors increase the output resistance of their respective circuits and allow higher gain at a given current. Thus, transistor 58 is ideally placed in series with source follower 52, which will lower the output resistance and allow for greater current to the load. The cost is a small voltage drop across each, slightly decreasing the efficiency of the circuit.

Figure 5:
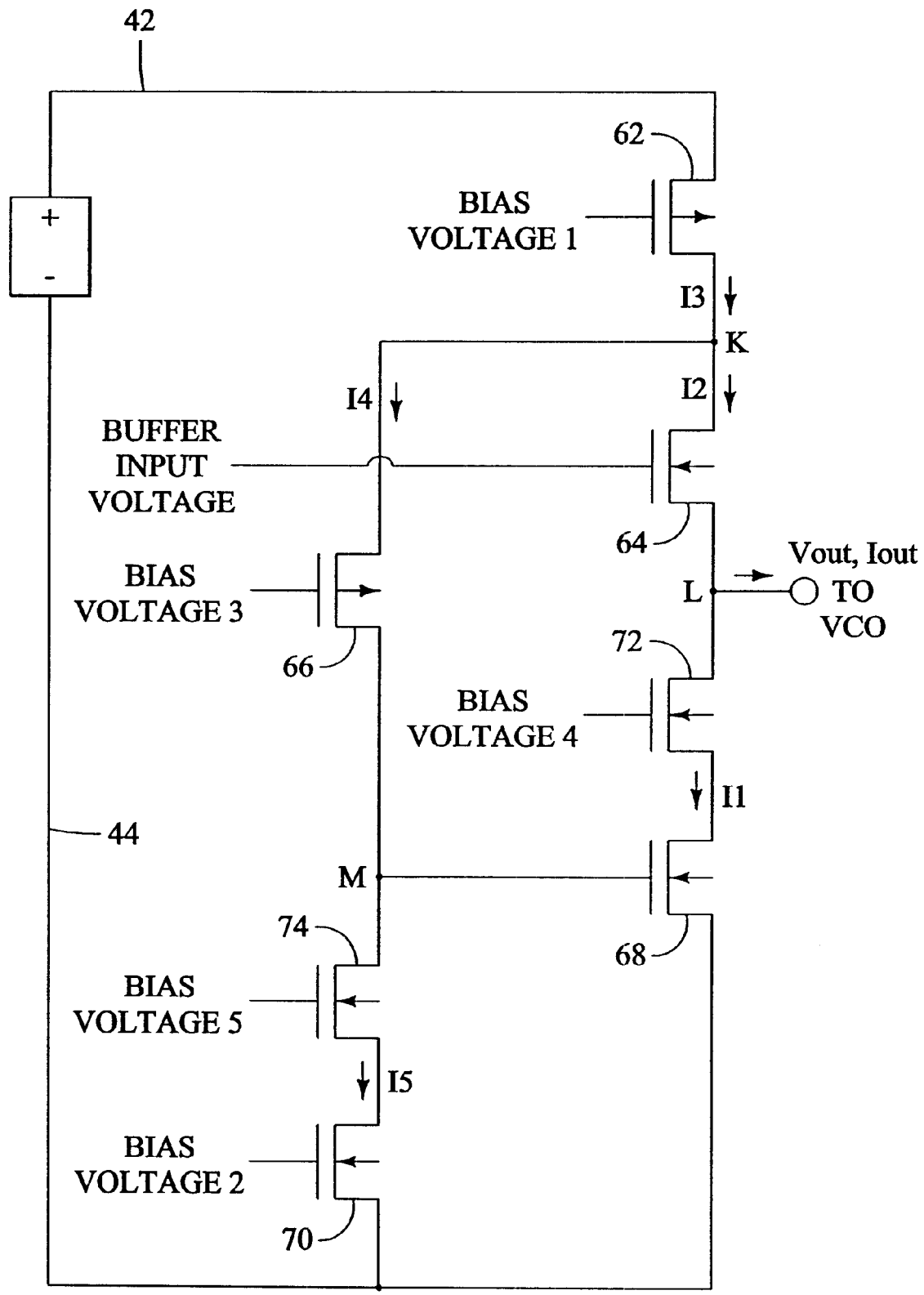

FIG. 5, in a similar manner, is an alternative embodiment of FIG. 3. Two additional transistors 72, 74 are cascaded with transistors 68 and 70, respectively. These two transistors increase the output resistance of their respective circuits and allow higher gain at a given current. Thus, transistor 72 is placed in series between source follower 68 and second point of connection L. The additional transistor lowers the output resistance and allows for greater current to the load. The cost is a small voltage drop across each additional transistor, slightly decreasing the efficiency of the circuit. The other additional transistor 74 is placed between fifth transistor 70 and the third point of connection M. The first point of connection between the first, second and third transistors is point K.

Figure 6:
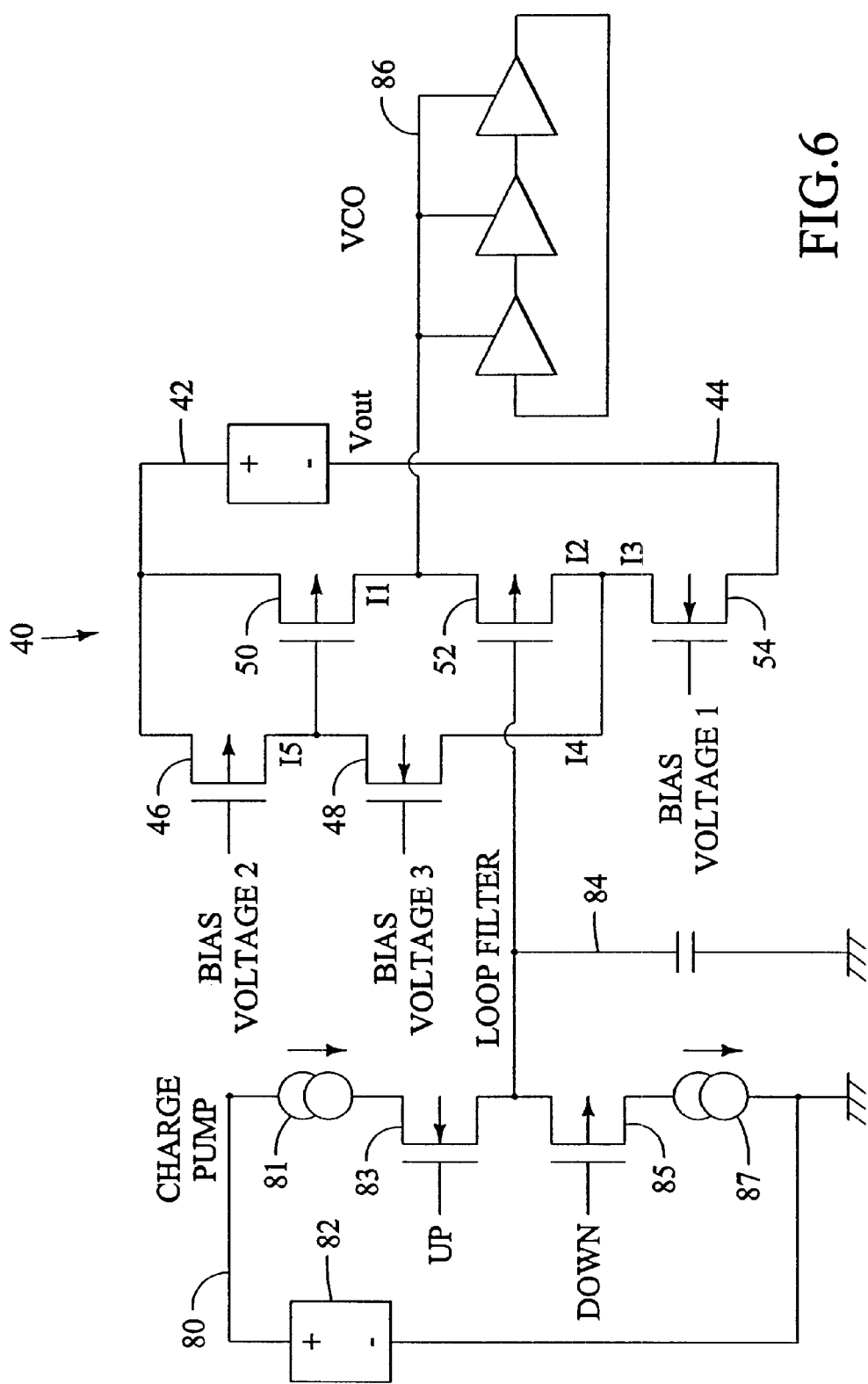
FIG. 6 depicts the power supply of FIG. 2 applied to a VCO circuit.

FIG. 6 depicts an embodiment of a current-feedback power supply 40 for connection to control and power portions of a VCO 86 and other essential parts of a complete circuit. The current feedback power supply is advantageously used in this application, having a greater voltage range in a very small space. A charge pump 80 with a first voltage supply 82 drives the buffer amplifier 52 portion of the power supply. Ideally, the charge pump 80 has its own source of power 82, while the current-feedback power supply 40 furnishes control voltage for VCO 86. Charge pump 80 may include current sources 81, 87, and transistors 83 and 85, having a current output to loop filter 84. Loop filter 84, in one embodiment, has a capacitor to ground. In other embodiments, loop filter 84 may include a resistor as well. The charge pump and loop filter charge and discharge through the capacitor, providing a control voltage to the gate of source follower transistor 52. Transistor 52 is an integral part of current-feedback power supply 40, with all other components as described above for FIG. 2. Bias voltages 1, 2 and 3 may also be provided for separate control of the respective transistors 54, 46 and 48. The voltage output of the power supply 40 then is connected to the VCO 86, as a supply and control voltage.

Figure 7:
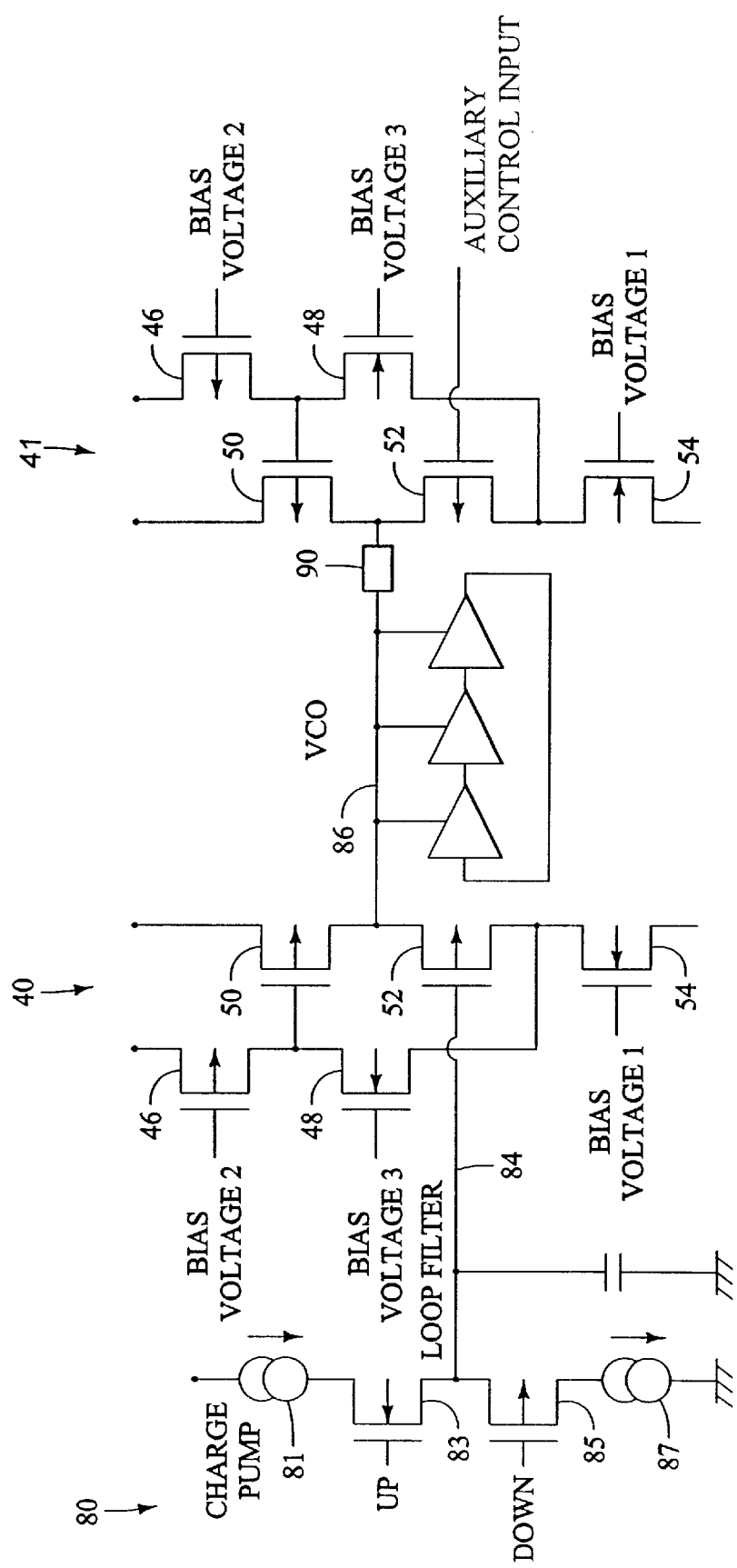
FIG. 7 depicts a VCO circuit having two summed power supplies with current-feedback design.

FIG. 7 is a further embodiment in which the circuit takes advantage of the unique properties of current feedback control, including the extra voltage available and the small space used. One particular advantage of the current feedback design is the ease of adding, or paralleling, power supplies. FIG. 7 depicts a VCO 86 requiring more power than can be easily supplied by a single power supply 40. Therefore, two current feedback power and control supplies 40, 41 are paralleled through a summing resistor 90 to supply the VCO 86. The ratio between the gain of the first and second input control voltages to the VCO may be set by picking the value of resistor 90 and the channel width of the buffer transistors 52. While a discrete is depicted and intended, a full range of resistances is available to a designer of a powered VCO, including the transconductance of the buffer amplifiers 50 of the buffered power supply. In this usage, gain means the change in VCO output frequency with control input voltage. This is typically expressed as frequency (Hz) per volt. One control input may have a gain of 3 GHz/volt while the second control input may have a gain of 39 MHz/volt. The intrinsic "transconductance" or its inverse, the resistance of the buffer amplifier, is one part of a toolbox a design engineer may apply in useful embodiments. The output of the VCO will be the result of the sum of the input voltages.

A first and a second current feedback power and control supply 40, 41 are connected to the VCO 86. As shown in the first power and control supply 40, a charge pump 80 and loop filter 84 are desirably included. It is understood that a charge pump and loop filter are desirable on both power supplies, or on as many as are used. Each current controlled power and control supply has first, third and fourth transistors, 46, 50 and 52, PMOS transistors as shown, and second and fifth transistors, 48 and 54, NMOS transistors, as shown, and bias voltages 1, 2 and 3 for control. All connections are as depicted in FIGS. 2 and 6. Alternatively, the current controlled power supply configuration of FIG. 3 may be used, with more NMOS transistors than PMOS. Of course, the embodiments of FIGS. 4 and 5, with the transistors added for lower output resistance, may also be used. In an alternative embodiment of the power and control supply 41, an auxiliary control input to the buffer amplifier 52 of the second current feedback power and control supply 41 may be used to control the VCO 86.

Figure 8:
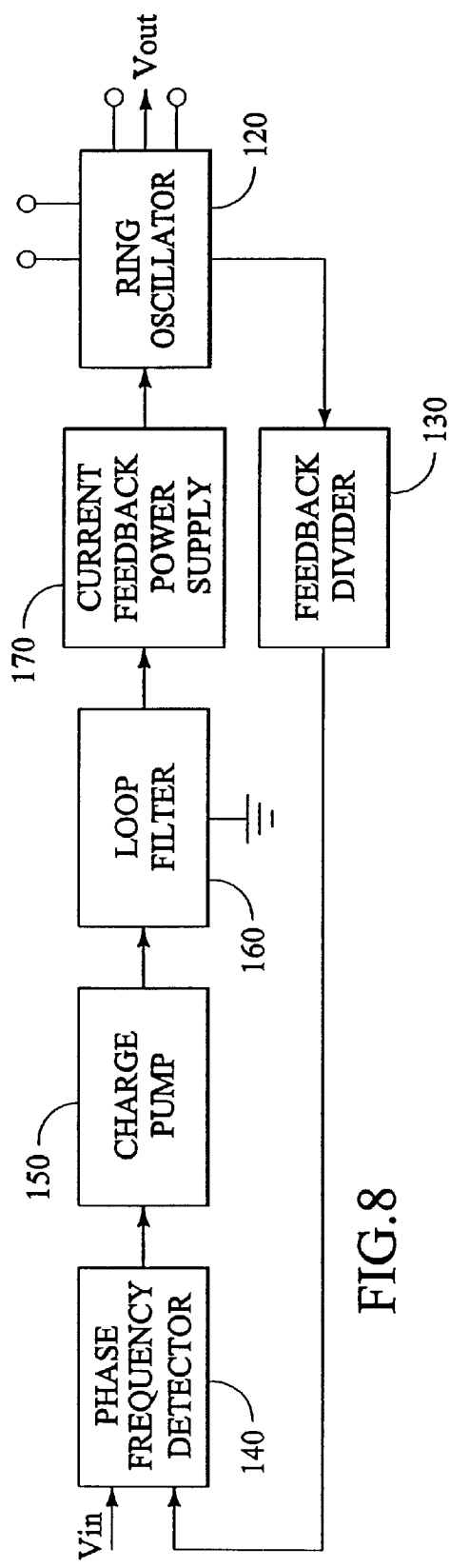
FIG. 8 depicts a current feedback applied to a phase locked loop.

FIG. 8 is an embodiment of a phase-locked loop using a voltage controlled ring oscillator 120 oscillator and a current feedback power supply 170. A voltage-controlled oscillator 120 or voltage-to-frequency converter may send an output signal to voltage divider 130 and simultaneously to a phase frequency detector 140. The VCO will run at input reference frequency, Vin, multiplied by the feedback divider factor. The output of the feedback counter is connected to the feedback input of the phase frequency detector. The charge pump 150 charges and discharges through a loop filter 160, which includes an RC filter. This provides a control input to current feedback power supply 170. In some embodiments, the output of the current feedback power supply are sufficient for both control and power to the VCO or ring oscillator. Multiple outputs of each desired phase may be taken from the VCO or ring oscillator 120.

Figure 9:
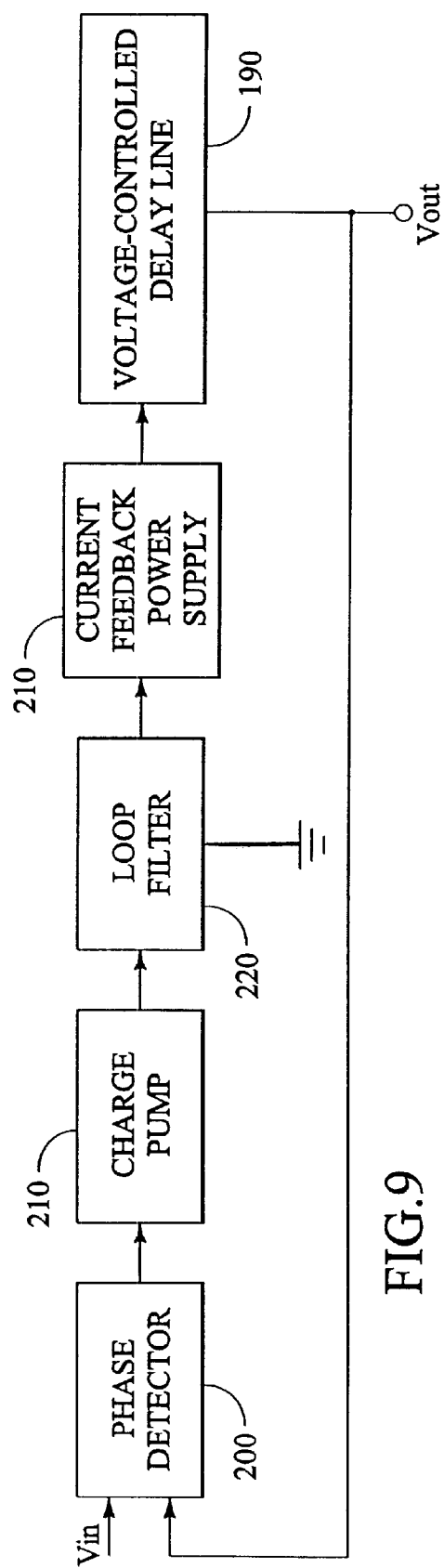
FIG. 9 depicts a current feedback power supply applied to a delay locked loop.

FIG. 9 is an embodiment of a current feedback power supply 210 used with a delay locked loop . A voltage signal is input into a phase detector 200 simultaneously with feedback from a voltage controlled oscillator 190. If the object of the delay locked loop is to remove a certain amount of delay, the output signal may be exactly one cycle (or an integral number of cycles) removed from the input. The output signal of the phase detector then charges a charge pump 210 through loop filter 220. The output signal is amplified and buffered by current feedback power supply 210 and then sent to control the oscillator 190.

Figure 10:
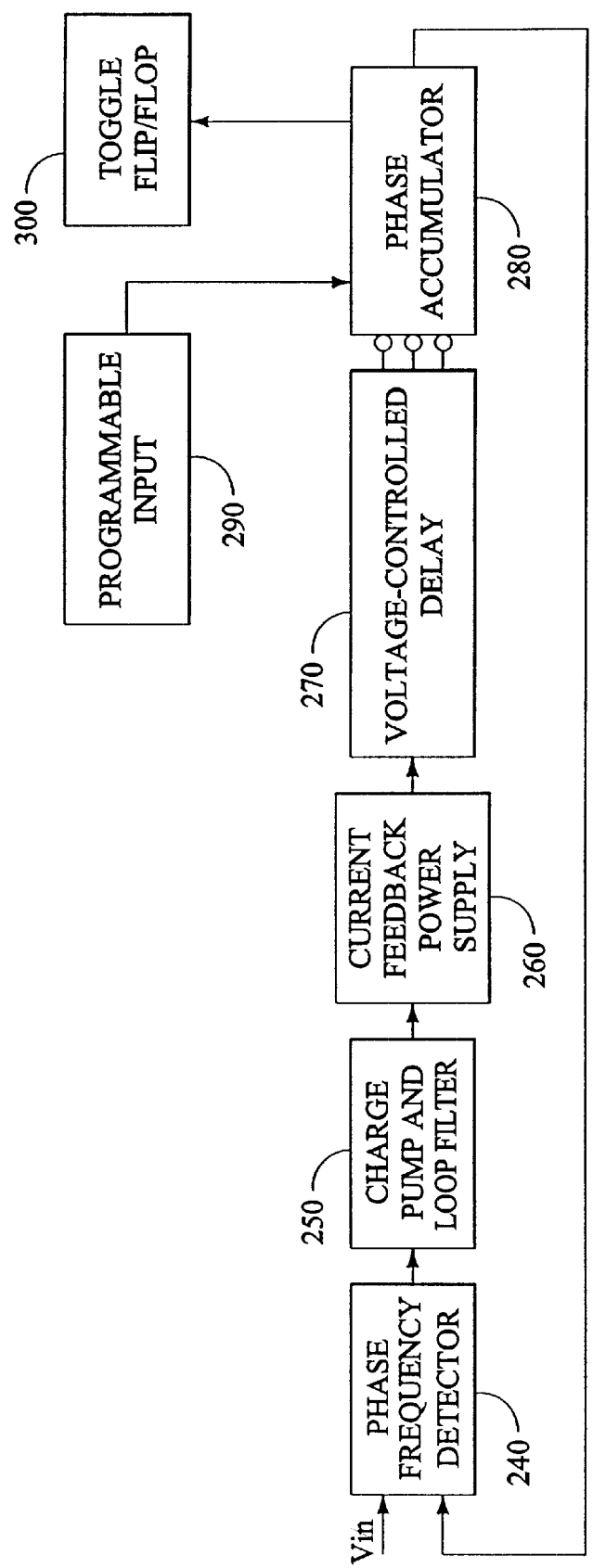
FIG. 10 depicts a current feedback power supply applied to a phase accumulator.

FIG. 10 is an embodiment with a phase accumulator 280 with a programmable input 290. A voltage signal is input to a phase frequency detector 240, along with feedback from the phase accumulator 280. The operation of the phase accumulator may be set to remove a certain amount of delay, and then sent to a charge pump and loop filter 250 and a current feedback power supply 260 before entering the VCO 270 as a control input and voltage source. All phase output signals from a VCO 270 may be connected to a phase accumulator 280 and thence used in outside circuits, such as a toggle flip/flop 300. In an 8-delay-unit VCO, there are 16 phase outputs possible. The phase accumulator 150 simply counts, based on the frequency input from the VCO 100. The frequency is added to the value of the current count. The counter will reach its maximum value and then roll over. The higher the frequency, the faster the counter will continue to turn over.

Although only a few embodiments of the invention have been discussed, other embodiments are contemplated. For example, power supplies may be required in many other kinds of instruments or circuits requiring reliable, efficient power supplies. It is therefore intended that the foregoing description illustrates rather than limits this invention, and that it is the following claims, including all equivalents, which define this invention. Of course, it should be understood that a wide range of changes and modifications may be made to the embodiments described above. Accordingly, it is the intention of the applicants to protect all variations and modifications within the valid scope of the present invention.

What is claimed is:

1. A buffered power supply, comprising:
   a first transistor and a second transistor connected in series at a first point of connection;
   a third transistor whose gate is connected to the first point of connection, said first and third transistors connected to a supply voltage;
   a fourth transistor connected at a second point of connection to the third transistor, said second point of connection being an output terminal of the buffered power supply; and
   a fifth transistor connected at a third point of connection to said third and fourth transistors, wherein the first and second transistors are a current feedback loop for the power supply.

2. The power supply of claim 1, wherein said second and fifth transistors are NMOS.

3. A voltage controlled oscillator, comprising:
   a charge pump and loop filter;
   a first buffered power supply, the buffered power supply receiving an input from the charge pump and loop filter, the buffered power supply further comprising a first transistor and a second transistor connected in series at a first point of connection;
   a third transistor whose gate is connected to the first point of connection, said first and third transistors connected to a supply voltage;
   a fourth transistor connected at a second point of connection to the third transistor, said second point of connection being an output terminal of the buffered power supply; and
   a fifth transistor connected at a third point of connection to said third and fourth transistors, wherein the first and second transistors are a current feedback loop for the power supply; and
   a voltage to frequency converter, wherein the charge pump and loop filter deliver a controlled voltage to the buffered power supply, the buffered power supply delivers a control voltage to the voltage to frequency converter, and the frequency converter generates a frequency of oscillation in accord with the voltage of the buffered power supply.

4. The voltage controlled oscillator of claim 3, wherein the control voltage is a power supply for the voltage to frequency converter.

5. The voltage controlled oscillator of claim 4, further comprising a summing resistor connected to an input line of the voltage to frequency converter, and a second buffered power supply connected to the summing resistor by a buffer amplifier of the second buffered power supply, wherein an output of the voltage controlled oscillator is determined by the sum of the voltages.

6. The voltage controlled oscillator of claim 5, wherein a gain of the first buffered power supply is different from a gain of the second buffered power supply.

7. A phase-locked loop, comprising:
   a phase frequency detector;
   a charge pump and loop filter connected to the phase frequency detector;
   a buffered power supply, receiving an input from the charge pump and loop filter, the buffered power supply further comprising a first transistor and a second transistor connected in series at a first point of connection;
   a third transistor whose gate is connected to the first point of connection, said first and third transistors connected to a supply voltage;
   a fourth transistor connected at a second point of connection to the third transistor, said second point of connection being an output terminal of the buffered power supply; and
   a fifth transistor connected at a third point of connection to said third and fourth transistors, wherein the first and second transistors are a current feedback loop for the power supply;
   a voltage controlled oscillator powered by the power supply; and
   a voltage divider connected between the oscillator and the phase frequency detector.

8. A delay locked loop, comprising:
   a phase detector;
   a charge pump and loop filter connected with the phase detector;
   a buffered power supply receiving an input from the loop filter, said buffered power supply further comprising a first transistor and a second transistor connected in series at a first point of connection;
   a third transistor whose gate is connected to the first point of connection, said first and third transistors connected to a supply voltage;
   a fourth transistor connected at a second point of connection to the third transistor, said second point of connection being an output terminal of the buffered power supply; and
   a fifth transistor connected at a third point of connection to said third and fourth transistors, wherein the first and second transistors are a current feedback loop for the power supply; and
   a voltage controlled oscillator powered by the buffered power supply, wherein the voltage control oscillator is also connected with the phase detector.

9. A phase accumulator circuit, comprising:
   a phase frequency detector;
   a charge pump and loop filter, connected with the phase frequency detector;
   a buffered power supply connected with the charge pump and loop filter, said buffered power supply further comprising a first transistor and a second transistor connected in series at a first point of connection;
   a third transistor whose gate is connected to the first point of connection, said first and third transistors connected to a supply voltage;
   a fourth transistor connected at a second point of connection to the third transistor, said second point of connection being an output terminal of the buffered power supply; and
   a fifth transistor connected at a third point of connection to said third and fourth transistors, wherein the first and second transistors are a current feedback loop for the power supply;
   a voltage controlled oscillator powered by the buffered power supply;
   a phase accumulator, connected with the voltage controlled oscillator and receiving inputs from the oscillator;
   a programmable control input, connected to the phase accumulator; and at least one toggle flip/flop, connected to the phase accumulator and receiving inputs from the phase accumulator.

10. The power supply of claim 1, further comprising a first additional transistor connected between the first transistor and the first point of connection, and a second additional transistor connected between the third transistor and the second point of connection, wherein the first additional transistor is a part of the current feedback loop for the power supply.

11. The power supply of claim 10, wherein the first and second additional transistors are PMOS.

12. A buffered power supply, comprising:
a first transistor, a second transistor and a third transistor, the second and third transistors connected to the first transistor at a first point of connection;
a fourth transistor connected in series to the second transistor at a second point of connection, said second point an output terminal of the power supply; and
a fifth transistor connected in series with the third transistor at a third point of connection, said third point connected to a gate of the fourth transistor,
wherein the first transistor is connected to a positive power supply, the second transistor is connected as a source follower for the first transistor, and the third and fifth transistors are a current feedback loop.

13. The power supply of claim 12, wherein the first and third transistors are PMOS transistors.

14. The power supply of claim 12, further comprising a first additional transistor connected between the second point of connection and the fourth transistor, and a second additional transistor connected between the third point of connection and the fifth transistor, wherein the feedback loop further includes the second additional transistor.

15. The power supply of claim 12, wherein the first and second additional transistors are NMOS transistors.

16. A voltage controlled oscillator, comprising:
a charge pump and loop filter;
a first buffered power supply, the buffered power supply receiving an input from the charge pump and loop filter, the buffered power supply further comprising a first transistor and a second transistor connected in series at a first point of connection;
a third transistor whose gate is connected to the first point of connection, said first and third transistors connected to a supply voltage;
a fourth transistor connected at a second point of connection to the third transistor, said second point of connection being an output terminal of the buffered power supply; and
a fifth transistor connected at a third point of connection to said third and fourth transistors, wherein the first and second transistors are a current feedback loop for the power supply; and
a voltage to frequency converter, wherein the charge pump and loop filter deliver a controlled voltage to the buffered power supply, the buffered power supply delivers a control voltage to the voltage to frequency converter, and the frequency converter generates a frequency of oscillation in accord with the voltage of the buffered power supply.

17. The voltage controlled oscillator of claim 16 wherein the control voltage is a power supply for the voltage to frequency converter.

18. The voltage controlled oscillator of claim 17, further comprising a summing resistor connected to an input line of the voltage to frequency converter, and a second buffered power supply connected to the summing resistor by a buffer amplifier of the second buffered power supply, wherein an output of the voltage controlled oscillator is determined by the sum of the voltages.

19. The voltage controlled oscillator of claim 18, wherein a gain of the first buffered power supply is different from a gain of the second buffered power supply.

20. A phase-locked loop, comprising:
a phase frequency detector;
a charge pump and loop filter connected to the phase frequency detector;
a buffered power supply receiving an input from the charge pump and loop filter, said buffered power supply further comprising a first buffered power supply, the buffered power supply receiving an input from the charge pump and loop filter, the buffered power supply further comprising a first transistor and a second transistor connected in series at a first point of connection;
a third transistor whose gate is connected to the first point of connection, said first and third transistors connected to a supply voltage;
a fourth transistor connected at a second point of connection to the third transistor, said second point of connection being an output terminal of the buffered power supply; and
a fifth transistor connected at a third point of connection to said third and fourth transistors, wherein the first and second transistors are a current feedback loop for the power supply;
a voltage controlled oscillator powered by the power supply; and
a voltage divider connected between the oscillator and the phase frequency detector.

21. A delay locked loop, comprising:
a phase detector;
a charge pump and loop filter connected with the phase detector;
a buffered power supply receiving an input from the loop filter, said buffered power supply further comprising a first buffered power supply, the buffered power supply receiving an input from the charge pump and loop filter, the buffered power supply further comprising a first transistor and a second transistor connected in series at a first point of connection;
a third transistor whose gate is connected to the first point of connection, said first and third transistors connected to a supply voltage;
a fourth transistor connected at a second point of connection to the third transistor, said second point of connection being an output terminal of the buffered power supply; and
a fifth transistor connected at a third point of connection to said third and fourth transistors, wherein the first and second transistors are a current feedback loop for the power supply; and
a voltage controlled oscillator powered by the buffered power supply, wherein the voltage control oscillator is also connected with the phase detector.

22. A phase accumulator circuit, comprising:
a phase frequency detector;
a charge pump and loop filter, connected with the phase frequency detector;
a buffered power supply connected with the charge pump and loop filter, said buffered power supply further comprising a first buffered power supply, the buffered power supply receiving an input from the charge pump and loop filter, the buffered power supply further comprising a first transistor and a second transistor connected in series at a first point of connection;

a third transistor whose gate is connected to the first point of connection, said first and third transistors connected to a supply voltage;

a fourth transistor connected at a second point of connection to the third transistor, said second point of connection being an output terminal of the buffered power supply; and a fifth transistor connected at a third point of connection to said third and fourth transistors, wherein the first and second transistors are a current feedback loop for the power supply;

a voltage controlled oscillator powered by the buffered power supply;

a phase accumulator, connected with the voltage controlled oscillator and receiving inputs from the oscillator;

a programmable control input, connected to the phase accumulator; and at least one toggle flip/flop, connected to the phase accumulator and receiving inputs from the phase accumulator.

23. A buffered power supply, comprising:

a first transistor connected in series as a current source with a second transistor, a cascade device, at a first point of connection;

a third transistor whose gate is connected to the first point of connection, said first and third transistors connected to a supply voltage, said third transistor being a main current source and error amplifier;

a fourth transistor connected as a buffer amplifier at a second point of connection to the third transistor, said second point of connection being an output terminal of the buffered power supply; and a fifth transistor connected at a third point of connection to said third and fourth transistors, said fifth transistor being a current source for the third and fourth transistors, wherein the first and second transistors are a current feedback loop for the power supply.

24. The power supply of claim 23, wherein said second and fifth transistors are NMOS.

25. The power supply of claim 23, further comprising a first additional transistor connected between the first transistor and the first point of connection, and a second additional transistor connected between the third transistor and the second point of connection, wherein the first additional transistor is a part of the current feedback loop for the power supply.

26. The power supply of claim 25, wherein the first and second additional transistors are PMOS.

27. A buffered power supply, comprising:

a first transistor, a second transistor and a third transistor, the second and third transistors connected to the first transistor at a first point of connection, wherein the first and second transistors are a current source and a source follower for the buffered power supply;

a fourth transistor connected in series to the second transistor at a second point of connection, said second point an output terminal of the power supply, the fourth transistor a main current source and error amplifier for the buffered power supply; and a fifth transistor connected in series as a current source with the third transistor at a third point of connection, said third point connected to a gate of the fourth transistor, wherein the first transistor is connected to a positive power supply, the second transistor is connected as a source follower for the first transistor, the third transistor is connected in series with the first transistor, and the third and fifth transistors are a current feedback loop.

28. The power supply of claim 27, wherein the first and third transistors are PMOS transistors.

29. The power supply of claim 27, further comprising a first additional transistor connected between the second point of connection and the fourth transistor, and a second additional transistor connected between the third point of connection and the fifth transistor, wherein the feedback loop further includes the second additional transistor.

30. The power supply of claim 29, wherein the first and second additional transistors are NMOS transistors.

* * * * *

UNITED STATES PATENT AND TRADEMARK OFFICE
CERTIFICATE OF CORRECTION

PATENT NO. : 6,525,613 B2
DATED : February 25, 2003
INVENTOR(S) : Sasan Cyrusian It is certified that error appears in the above-identified patent and that said Letters Patent is hereby corrected as shown below:

<u>Title page,</u>
Item [56], OTHER PUBLICATIONS, 4th reference, delete "www.idema.or/" and substitute -- www.idema.org/ -- in its place.
5th reference, delete "storageview.com" and substitute -- storagereview.com -- in its place.

<u>Column 9,</u>
Line 63, immediately after "claim 16" insert -- , -- (comma).

Signed and Sealed this

Twenty-sixth Day of August, 2003

JAMES E. ROGAN
*Director of the United States Patent and Trademark Office*